(12) United States Patent
Sinangil et al.

(10) Patent No.: US 9,762,216 B1
(45) Date of Patent: Sep. 12, 2017

(54) LEVEL SHIFTER CIRCUIT USING BOOSTING CIRCUIT

(71) Applicant: Taiwan Semiconductor Manufacturing Co., Ltd., Hsinchu (TW)

(72) Inventors: Mahmut Sinangil, Sunnyvale, CA (US); Hsin-Hsin Ko, Hsinchu (TW); Chiting Cheng, Taichung (TW); Yen-Huei Chen, Zhudong Township (TW); Hung-Jen Liao, Hsinchu (TW); Jonathan Tsung-Yung Chang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/065,166

(22) Filed: Mar. 9, 2016

(51) Int. Cl.
  *H03L 5/00* (2006.01)
  *H03K 3/356* (2006.01)
  *H03K 19/0185* (2006.01)

(52) U.S. Cl.
  CPC .......... *H03K 3/356113* (2013.01); *H03K 19/018521* (2013.01)

(58) Field of Classification Search
  CPC ............ H02M 3/07; H02M 2003/077; H02M 2003/075; H02M 2001/0041; H02M 2001/0032
  USPC ........ 327/534–540, 306, 333; 455/323, 326; 326/61–62, 80–81
  See application file for complete search history.

(56) References Cited

U.S. PATENT DOCUMENTS

| | | | |
|---|---|---|---|
| 8,405,442 B2 | 3/2013 | Chen | |
| 8,436,671 B2 | 5/2013 | Chern et al. | |
| 8,610,488 B2 | 12/2013 | Yu et al. | |
| 8,625,240 B2 | 1/2014 | Chung et al. | |
| 8,643,426 B2* | 2/2014 | Zhang | H03K 3/356182 326/81 |
| 8,847,659 B1 | 9/2014 | Lan et al. | |
| 9,197,199 B2 | 11/2015 | Huang et al. | |
| 9,214,933 B2 | 12/2015 | Chern et al. | |
| 2005/0285658 A1* | 12/2005 | Schulmeyer | H03K 25/02 327/333 |

* cited by examiner

*Primary Examiner* — Dinh T Le
(74) *Attorney, Agent, or Firm* — Sterne, Kessler, Goldstein & Fox, PLLC (57) ABSTRACT

A level shifter circuit is provided that uses a boosting circuit. The boosting circuit is configured to improve the operation of the level shifter circuit when the high voltages of voltage domains across the level shifter circuit are widely separated. A circuit apparatus includes a core level shifter circuit that changes a first voltage of an input signal to a second voltage of an output signal. The circuit apparatus further includes a first boosting circuit that is coupled to the core level shifter circuit and generates a first transient voltage applied to the core level shifter circuit when the input signal transitions from a low value to a high value. The circuit apparatus also includes a second boosting circuit that is coupled to the core level shifter circuit and generates a second transient voltage applied to the core level shifter circuit when the input signal transitions from a high value to a low value.

20 Claims, 4 Drawing Sheets

LEVEL SHIFTER CIRCUIT USING BOOSTING CIRCUIT

BACKGROUND

Field

The present disclosure relates generally to a level shifter circuit that uses a boosting circuit. The boosting circuit is configured to improve the operation of the level shifter circuit when, for example, the high voltages of voltage domains across the level shifter circuit are widely separated.

Background Art

Level shifter circuits are circuits that can be used to convert signals from one logic level to another. For example, level shifter circuits can be used between two circuits that use different voltage levels (e.g., different values for high voltage.) A level shifter circuit can be placed between these two circuits to convert one voltage to another such that each of the two circuits would be able to detect, for example, a high signal, based on the corresponding high voltage values. Level shifter circuits are used in various circuits, for example, but not limited to, static random-access memory (SRAM) and dual-rail SRAM circuits, where the SRAM cells are connected to higher voltage(s) than the rest of the SRAM peripheral circuitry, which are connected to lower voltages. Level shifter circuits are used to shift up the signals going to the SRAM cells.

BRIEF DESCRIPTION OF THE DRAWINGS/FIGURES

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

The present disclosure will now be described with reference to the accompanying drawings. In the drawings, generally, like reference numbers indicate identical or functionally similar elements. Additionally, generally, the left-most digit(s) of a reference number identifies the drawing in which the reference number first appears.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

A large difference between the high voltages of voltage domains across a level shifter circuit can affect the operation of the level shifter circuit. Solutions such as sizing, multi-threshold, etc. have been used to remedy this issue with level shifter circuits. However, these solutions introduce significant area and/or power overhead with limited benefit. Various embodiments of this disclosure, as discussed in detail below, add boosting circuit(s) to a core level shifter circuit to internally boost the lower voltage in order to effectively make the difference between two high voltages smaller.

Figure 1:
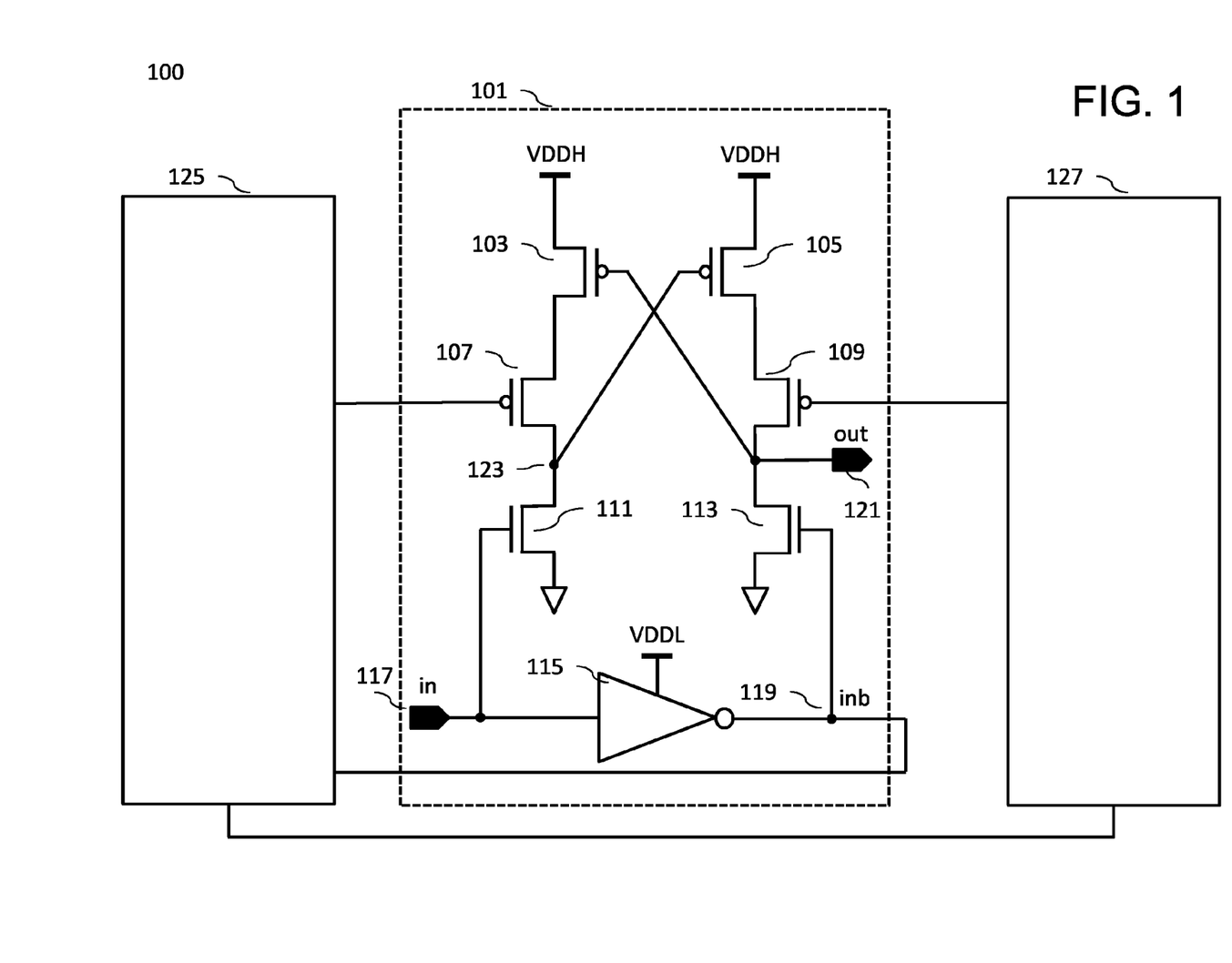
FIG. 1 illustrates a level shifter circuit with boosting circuit(s), in accordance with some embodiments.

FIG. 1 illustrates a level shifter circuit with boosting circuit(s), in accordance with some embodiments. Level shifter circuit 100 includes a core level shifter circuit 101 and one or more boosting circuits 125 and 127.

Core level shifter circuit 101 includes transistors 111 and 113, which can be, but not limited to, n-type field-effect transistors (FET), such as n-type metal-oxide-semiconductor field-effect transistors (MOSFETs). In one example, transistors 111 and 113 operate as pull down devices. Core level shifter circuit 101 also includes transistors 103, 105, 107, and 109, which can be, but not limited to, p-type FETs, such as p-type MOSFETs. In one example, transistors 103, 105, 107, and 109 operate as pull up devices. In this example, transistors 103 and 105 operate as active loads with cross-couple connection to the output terminal of core level shifter circuit 101.

As illustrated in FIG. 1, source of transistor 103 is connected to power supply VDDH. Drain of transistor 103 is connected to source of transistor 107. Drain of transistor 107 is connected to drain of transistor 111. The connection point between drain of transistor 107 and drain of transistor 111 is considered as output 123, which has an inverted value with respect to output signal at output terminal 121. Source of transistor 111 is connected to ground. Gate of transistor 103 is connected to drain of transistor 109, drain of transistor 111, and output terminal 121. Gate of transistor 107 is connected to boosting circuit 125. Gate of transistor 111 is connected to input terminal 117 and input terminal of inverting element and/or logic 115.

Similarly, source of transistor 105 is connected to voltage supply VDDH and gate of transistor 105 is connected to drain of transistor 107, drain of transistor 111, and output 123. Drain of transistor 105 is connected to source of transistor 109. Gate of transistor 109 is connected to boosting circuit 127 and drain of transistor 109 is connected to drain of transistor 113 and output terminal 121. Source of transistor 113 is connected to ground and gate of transistor 113 is connected to output terminal of inverting element/logic 115. Inverting element/logic 115 is also connected to voltage supply VDDL. In one example, inverting element/logic 115 is a circuit, a logical gate, and/or a logic configured to perform a logical negation.

Level shifter circuit 100 is configured to change the high voltage level of an input signal on input terminal 117 from VDDL to VDDH. In other words, when a signal is input to level shifter circuit 100 at input terminal 117, where the logic 1 of the signal has a voltage of VDDL, level shifter circuit 100 is configured to change the voltage of VDDL to VDDH such that the next circuit (coupled to level shifter 100—not shown) would be able to recognize the signal as logic 1. Level shifter circuit 100 is configured to internally boost the lower voltage (e.g., VDDL) to reduce the difference between two voltages (e.g., VDDL and VDDH).

According to one exemplary operation, when the input in to input terminal 117 is logic 0 (e.g., 0 volts), node 119 would be at logic 1 (e.g., VDDL volts) because of, for example, inverting element/logic, e.g., inverter, 115. In this case, transistor 113 would be on, resulting in output terminal 121 being electrically connected to ground and therefore the output of output terminal 121 would also be logic 0. In other words, input signal logic 0 at terminal 117 will be converted to output signal logic 0 at output terminal 121. Since gate of transistor 103 is connected to output terminal 121 and has logic 0, transistor 103 would be on. Gate of transistor 107 is connected to boosting circuit 125. In this case, the gate of transistor 107 would be connected to a signal with logic 0 (e.g., 0 volts), making transistor 107 on. Since both transistors 103 and 107 are on and transistor 111 is off (gate of transistor 111 has logic 0), node 123 would be electrically connected to VDDH. Continuing with this example, the gate of transistor 105 would also be electrically connected to VDDH, causing transistor 105 to be off. Gate of transistor 109 is connected to boosting circuit 127 and in this example, the gate of transistor 109 would be connected to a signal with logic 1 (e.g., voltage VDDL). Therefore, transistor 109 is also off.

When the input signal in to input terminal 117 is logic 1 (e.g., VDDL volts), transistor 111 is on and therefore node 123 is electrically connected to ground, which is 0 volts. When node 123 is at 0 volts, transistor 105 is on. Gate of transistor 109 is connected to boosting circuit 127 and in this example, the gate of transistor 109 would be connected to signal of logic 0, resulting in transistor 109 to be on. Therefore, output terminal 121 would be electrically connected to voltage supply VDDH since both transistor 105 and transistor 109 are on and transistor 113 is off (gate of transistor 113 has logic 0). In other words, an input signal logic 1 (e.g., VDDL volts) at terminal 117 will be converted to an output signal logic 1 (e.g., VDDH volts) at output terminal 121. Continuing with this example, gate of transistor 103 is connected to output terminal 121 (which is at VDDH volts in this example), and therefore transistor 103 would be off. Gate of transistor 107 is connected to boosting circuit 125 and in this case, the gate of transistor 107 would be connected to signal logic 1 (e.g., VDDL volts), so that transistor 107 is off.

In a level shifter circuit of another approach, instead of boosting circuits 125 and 127, gate of transistor 107 is connected to input terminal 117 and gate of transistor 109 is connected to gate of transistor 113 and node 119 (no boosting circuit exists). In this level shifter circuit of another approach, before, for example, input signal in transitions from low (e.g., 0 voltage) to high (e.g., VDDL), transistors 103 and 107 are on and voltage at source of transistor 111 is at VDDH. In this level shifter circuit of another approach, when the input signal in transitions, for example, from low (e.g., 0 voltage) to high (e.g., VDDL), if the difference between VDDL and VDDH is high and/or VDDL is close to or lower than the threshold voltage of transistor 111, VDDL will not be high enough to turn transistor 111 on and/or turn off transistor 107. In other words, the voltage between transistor 111 and transistor 107 (the voltage at node 123, which at input signal logic 0 is at VDDH) cannot go low enough. Therefore, the feedback between the cross-coupled transistors 103, 105, 107, and 109 cannot latch and this level shifter circuit of another approach will not be able to switch the output from logic 0 to 1. In addition to the difference between VDDL and VDDH, the problem of not being able to switch the output from logic 0 to 1 with this level shifter circuit of another approach can occur if the p-type transistors (e.g., transistors 103, 105, 107, and/or 109) are too "strong" because of global or local process variations, temperature effects, etc. Additionally or alternatively, the problem of not being able to switch the output from logic 0 to 1 with this level shifter circuit of another approach can occur if VDDL is close to or lower than the threshold voltage of transistors 111 and 113. A similar problem of not being able to switch the output from logic 1 to 0 can occur when the input signal transitions from high to low with respect to transistors 105, 109, and 113.

Level shifter circuit 100 uses boosting circuits 125 and 127 to boost the internal voltage applied to the gate of transistors 107 and 109 in order to reduce the difference between the high value of lower voltage domain (e.g., VDDL) and the high value of higher voltage domain (e.g., VDDH). In other words, the boosting circuits 125 and 127 cause p-type transistor 107 "weaker" by boosting the internal/local voltage applied to its gate so that p-type transistor 107 can turn off "stronger". Another solution to the problem includes making n-type transistor 111 "stronger".

Herein, the "weaker" and "stronger" terminology refers to the amount of current that the transistors can conduct. For example, "stronger" indicates a transistor having a higher driving strength and/or it can conduct a larger current. The driving strengths and/or how weak or strong a current that transistors can conduct can determine the voltage between them. For example, for a stronger pull down circuit (e.g., transistor 111), the pull down circuit conducts a larger current and therefore, the voltage at the middle point (e.g., node 123) between the pull down circuit and the pull up circuit (e.g., transistors 103 and 107) is pulled down closer to 0 volts, which helps core level shifter circuit 100 to switch to the next state.

Figure 2:
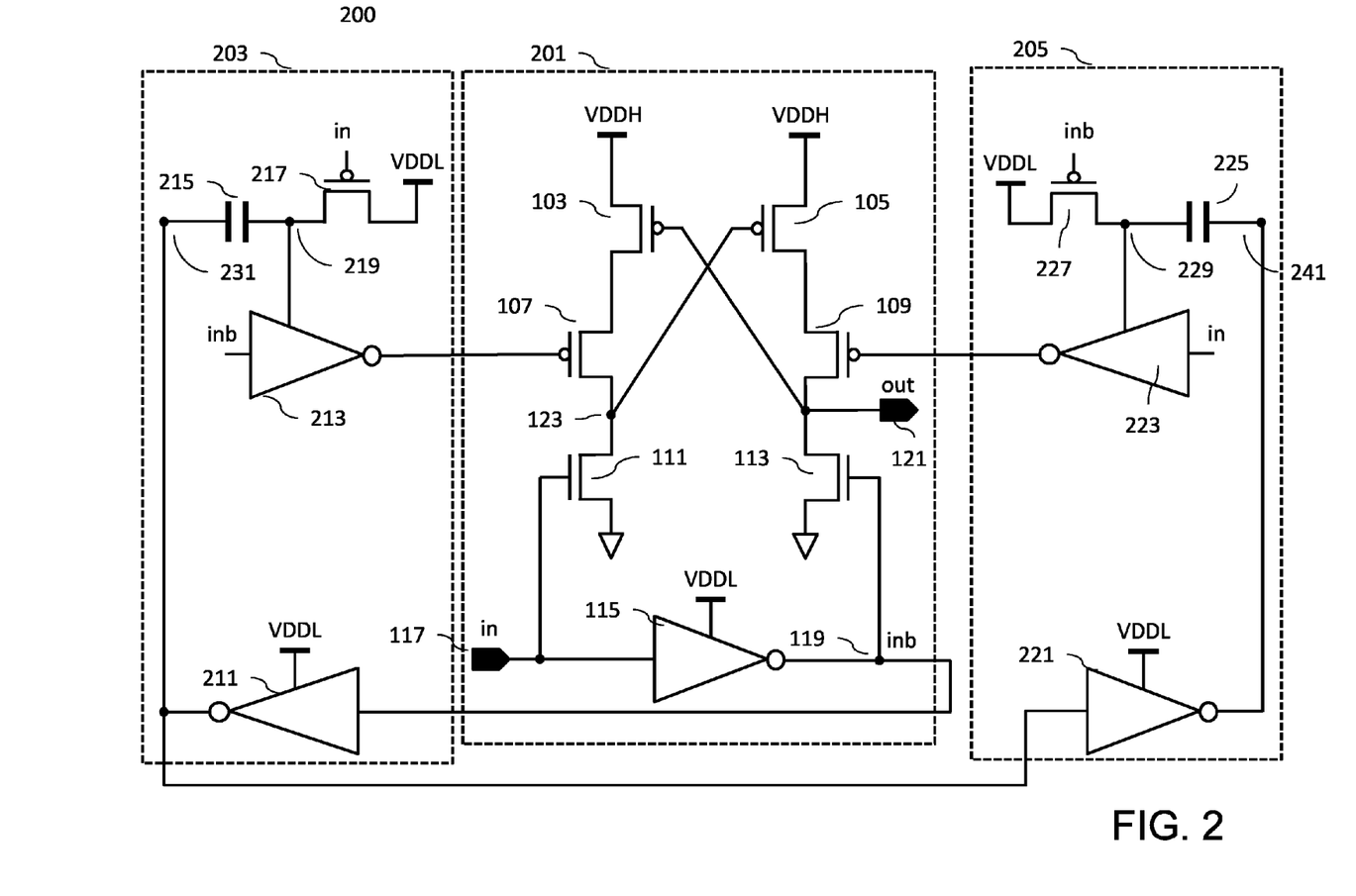
FIG. 2 illustrates a level shifter circuit with boosting circuit(s), in accordance with some embodiments.

FIG. 2 illustrates another level shifter circuit with boosting circuit(s), in accordance with some embodiments. Level shifter circuit 200 includes a core level shifter circuit 201 and one or more boosting circuits (e.g., charge pump circuits) 203 and 205. In one embodiment, core level shifter circuit 201 of FIG. 2 is similar to core level shifter circuit 101 of FIG. 1. However, other examples of core level shifter circuits can also be used. Boosting circuits 203 and 205 of FIG. 2 are exemplary embodiments of boosting circuits 125 and 127 of FIG. 1. However, other examples of boosting circuits can also be used.

According to this exemplary embodiment, boosting circuit 203 includes an inverting element and/or logic, such as inverter, 211. The input terminal of inverter 211 is connected to node 119, which is the output of inverter 115. Inverter 211 is connected to voltage supply VDDL. The output terminal of inverter 211 is connected to one terminal of capacitive element 215. In one example, capacitive element 215 includes a capacitor. The other terminal of capacitive element, e.g., capacitor, 215 is connected to node 219, which is connected to transistor 217. In one example, transistor 217 can be a p-type FET (e.g., a p-type MOSFET). Transistor 217 is connected to voltage supply VDDL at its source and the gate of transistor 217 is configured to receive the same input signal that is received at input terminal 117 (e.g., the gate of transistor 217 is connected to input terminal 117). Boosting circuit 203 further includes an inverting element and/or logic, such as inverter, 213. The input terminal of inverter 213 is connected to node 119 that is connected to the output of inverter 115 so as to receive signal "inb," which is the opposite logic level of the input signal received at input terminal 117. The output terminal of inverter 213 is connected to the gate of transistor 107 in core level shifter circuit 201. Inverter 213 is further connected to node 219 to receive its power supply. In other words, inverter 213 has a voltage supply that is provided by the terminal of capacitor 215 that is connected to node 219.

Continuing with this exemplary embodiment, boosting circuit 205 includes an inverting element and/or logic, such as inverter, 221. The input terminal of inverter 221 is connected to output terminal of inverter 211. Inverters 211 and 221 are connected to voltage supply VDDL for their respective power supply. The output terminal of inverter 221 is connected to one terminal of capacitive element 225. In one example, capacitive element 225 includes a capacitor. The other terminal of capacitive element, e.g., capacitor, 225 is connected to node 229, which is connected to transistor 227. In one example, transistor 227 can be a p-type FET (e.g., a p-type MOSFET). Transistor 227 is connected to voltage supply VDDL at its source and the gate of transistor 227 is connected to node 119, so as to receive signal inb, which is the opposite logic level of the input signal in received at input terminal 117. Boosting circuit 205 further includes an inverting element and/or logic, such as inverter, 223. The input terminal of inverter 223 is connected to the input terminal 117, so as to receive the input signal, and the output terminal of inverter 223 is connected to gate of transistor 109 in core level shifter circuit 201. Inverter 223 is further connected to node 229 to receive its power supply. In other words, inverter 223 has a voltage supply that is provided by the terminal of capacitor 225 that is connected to node 229.

In the exemplary embodiment, boosting circuits 203 and 205 are configured to charge capacitors 215 and 225, respectively, and then use their charges during transient modes to boost the local voltages at the gates of transistors 107 and 109. In other words, the boosted internal/local voltages at transistors 107 and 109 enable these transistors to turn off more completely so that the currents conducted by these transistors become weaker (smaller) during this transient stage. This effect helps transistors 111 and 113 overcome the feedback between the two sides of level shifter circuit 200 (e.g., the feedback between output terminal 121 to transistor 101 and from node 123 to transistor 105) and to switch the output of level shifter circuit 200 on output terminal 121 based on the input signal in on input terminal 117. In other words, boosting circuits 203 and 205 are configured to help core level shifter circuit 201 to switch output signal on output terminal 121 from low to high (or vice versa) when input signal in on input terminal 117 switches from low to high (or vice versa).

When the input signal in is low (e.g., logic 0, when, for example, input to input terminal 117 is at 0 volts), the output of inverter 211 is also low. Therefore, the terminal of capacitor connected to inverter 211 is also at 0 volts. On the other hand, since input signal in is low, transistor 217 is on and therefore, node 219 (to which the other terminal of capacitor 215 is connected) is high (e.g., 1, or VDDL volts because node 219 is electrically connected to VDDL.) Therefore, capacitor 215 is being charged and is getting ready for boosting during the next transient stage. In other words, when input signal in is low, capacitor 215 is charged such that the voltage difference between its two terminals is VDDL.

When the input signal in transitions from low to high (e.g., from 0 volts to VDDL), transistor 217 of boosting circuit 203 turns off, and therefore, node 219 is floating. After two inverter delays of inverters 115 and 211, the high input signal causes the left terminal 231 of capacitor 215 to pull to high (e.g., VDDL volts). Because of the nature of capacitor 215, the voltage across it does not change instantaneously. Therefore, when terminal 231 of capacitor 215 goes to VDDL volts, terminal 219 of capacitor 215 tries to go to 2×VDDL volts to try to keep the same voltage difference (VDDL volts) across the terminals of capacitor 215. This creates the boosting effects. In one example, the voltage at node 219 will increase from VDDL volts to a voltage less than or equal to 2×VDDL volts. The boosted voltage of node 219 can depend on, for example, the size of capacitor 215, capacitance ratio of node 219, the load connected to node 219 (e.g., inverter 213 and transistor 107), etc. According to one example, the circuit of core level shifter 201 (or any section of it) and/or any section of level shifter circuit 200 can be designed to optimize the maximum voltage to which node 219 can increase. This optimization can be based on how much boosting is needed at the gate of transistor 107. For example, for an ideal capacitor 215 that is not connected to invertor 213 and transistor 107, the voltage at node 219 can go to 2×VDDL volts. However, if capacitor 215 is not ideal and capacitor 215 is connected to invertor 213 and transistor 107, the voltage at node 219 will increase, for example, to a voltage between VDDL volts and 2×VDDL volts. In one example, a circuit designer can determine a voltage value for node 219 and the circuit designer would design the size of capacitor 215, the characteristics of inverter 213, the characteristics of transistor 107, etc., to reach the determined voltage value for node 219. During this transition, the input "inb" to inverter 213 is low (e.g., logic 0, because input signal in is high (e.g., 1)). Accordingly, the output of inverter 213 is high, with a voltage level determined by the power supply provided by node 219. In this case, the high value of output of inverter 213 is equal to the voltage of node 219, which is larger than VDDL due to the boosting effect (e.g., approximately 2×VDDL volts). Therefore, the voltage of node 219 is transferred to gate of transistor 107 of core level shifter circuit 201. In other words, when the input signal in transitions from 0 volts to VDDL volts, the gate of transistor 107 transitions from 0 volts to a voltage that is larger than VDDL volts to help turn off transistor 107 more completely to help with the struggle between pull up and pull down sections of core level shifter circuit 201.

It is noted that although boosting circuits 203 and 205 are discussed as illustrated in FIG. 2, any other boosting circuits that increase the voltages to the gates of transistors 107 and 109 can also be used. For example, any other boosting circuits that charge a capacitive element (e.g., a capacitor) and release that charge to boost the voltages to the gates of transistors 107 and 109 can be used.

One purpose of boosting circuits 125 and 127 or 203 and 205 is to generate a transient voltage greater than VDDL and apply it to the gates of transistors 107 and/or 109 during the transition of the input signal, so as to more completely cut off transistors 107 and/or 109.

Continuing with this example, when the input signal in is high (e.g., at VDDL volts), the output of inverter 221 is low (e.g., logic 0, at 0 volts). Therefore, the terminal 241 of capacitor 225 connected to inverter 221 is also at 0 volts. On the other hand, since input signal in is high, signal "inb" is low, so that transistor 227 is on, and therefore node 229 (to which the other terminal of capacitor 225 is connected) is at logic 1 (e.g., VDDL volts—node 229 is electrically connected to VDDL.) Therefore, capacitor 225 is being charged and is getting ready for boosting during next transient stage.

In other words, when input signal in is high, capacitor 225 is charged such that the voltage difference between its two terminals is VDDL.

When the input signal in transitions from high to low (e.g., from VDDL volts to 0 volt), transistor 227 of boosting circuit 205 turns off. Therefore, node 229 will be floating. After two inverter delays of inverters 115 and 221, the left terminal 241 of capacitor 225 will pull to high (e.g., VDDL volts). Because of the nature of capacitor 225, the voltage across it does not change instantaneously. Therefore, when terminal 241 of capacitor goes to VDDL volts, terminal 229 of capacitor 225 tries to go to 2×VDDL volts for a period of time to try to keep the same voltage difference (VDDL volts) across capacitor 225. This would create the boosting effects. In one example, the voltage at node 229 will increase from VDDL volts to a voltage less than or equal to 2×VDDL volts. The boosted voltage of node 229 can depend on, for example, the size of capacitance 225, capacitance ratio of node 229, the load connected to node 229 (e.g., inverter 223 and transistor 109), etc. According to one example, the circuit of core level shifter 201 (or any section of it) and/or any section of level shifter circuit 200 can be designed to optimize the maximum voltage to which node 229 can increase. This optimization can be based on the how much boosting is needed at the gate of transistor 109. For example, for an ideal capacitor 225 that is not connected to invertor 213 and transistor 109, the voltage at node 229 can go to 2×VDDL volts. However, if capacitor 225 is not ideal and capacitor 225 is connected to invertor 223 and transistor 109, the voltage at node 229 will increase, for example, to a voltage between VDDL volts and 2×VDDL volts. In one example, a circuit designer can determine a voltage value for node 229 and the circuit designer would design the size of capacitor 225, the characteristics of inverter 223, the characteristics of transistor 109, etc., to reach the determined voltage value for node 229. During this transition, the input to inverter 223 is low (e.g., logic 0, because input signal in is low (e.g., logic 0)). Accordingly, the output of inverter 223 would be high. In this case, the high value of output of inverter 223 is equal to the voltage of node 229, which is larger than VDDL. Therefore, the voltage of node 229 is transferred to gate of transistor 109 of core level shifter circuit 201. In other words, when the input signal in transitions from VDDL volts to 0 volts, the gate of transistor 109 transitions from 0 volts to a voltage that is larger than VDDL volts to turn off transistor 109 more completely, and therefore help with the struggle between pull up and pull down sections of core level shifter circuit 201.

In summary, when input signal in is low, capacitor 215 is charged. During the input signal's transition from low to high, boosting circuit 203 (through charged capacitor 215) helps to boost the voltage that is applied to gate of transistor 107. On the other hand, when input signal is high, capacitor 225 is charged. During the input signal's transition from high to low, boosting circuit 205 (through charged capacitor 225) helps to boost the voltage that is applied to gate of transistor 109.

Figure 3:
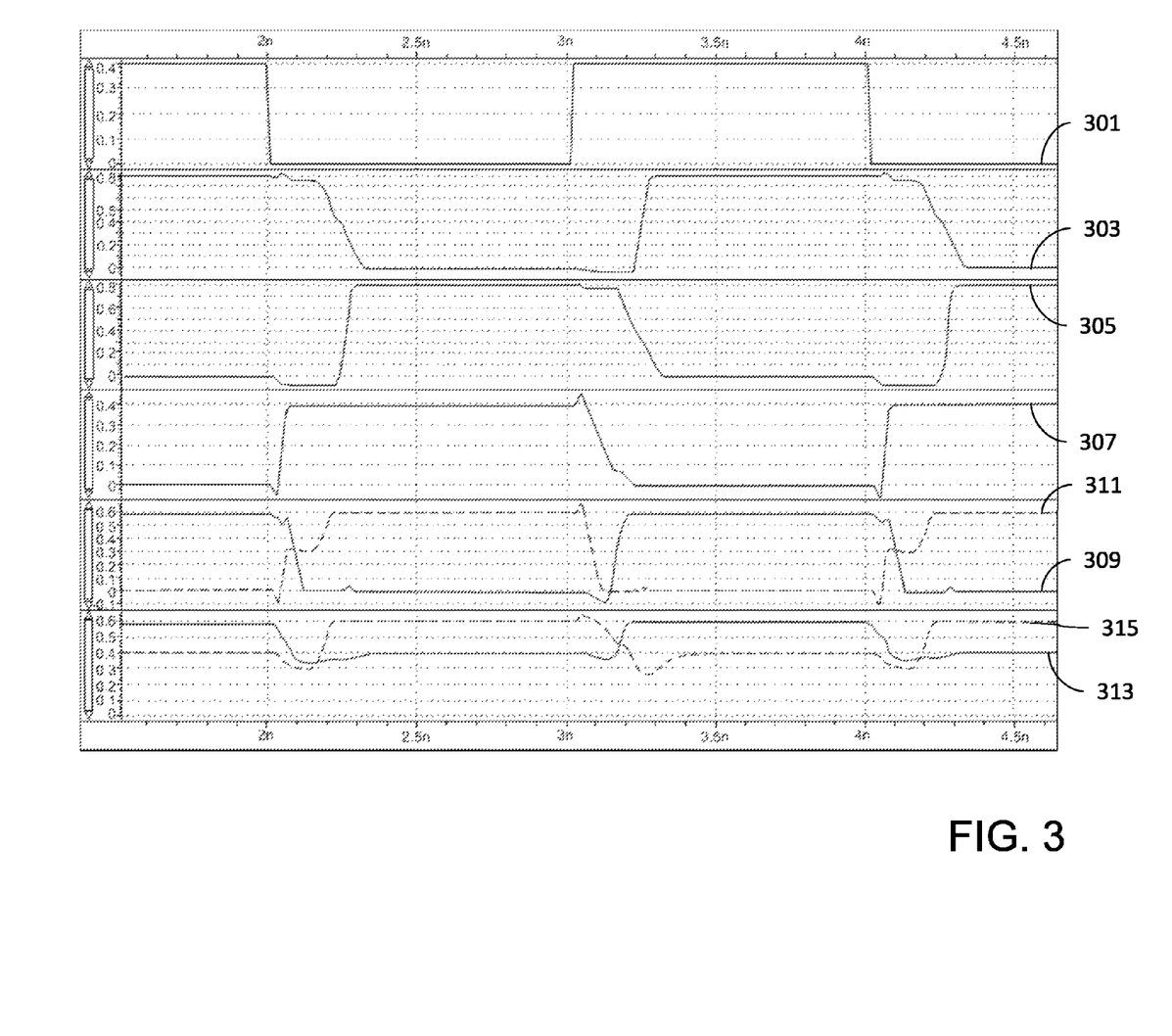
FIG. 3 illustrates voltage waveforms at different nodes of a level shifter circuit, in accordance with some embodiments.

The operation of the boosting circuits for level shifter 200 is illustrated, for example, in FIG. 3. Referring to FIG. 3, the input signal 301 (such as input signal in on, e.g., terminal 117, of FIG. 2) is low between 2 nanosecond (ns) and 3 ns. During this time interval, a signal 307 that is an opposite logic level to the input signal (signal "inb"—an inverted of input signal 301 through inverter 115) is high. The high value for signals 301 and 307 is VDDL volts that is approximately 0.4 volts in this example. When the input signal 301 is low, the output signal 303 (such as output signal on output terminal 121 of FIG. 2) is also low and the signal 305 at node 123 (a signal that is an opposite logic level to the output signal 303) is high. The high value for signals 303 and 305 is VDDH volts that is approximately 0.8 volts in this example.

Waveforms 309 and 311 illustrate the voltage at gate of transistors 107 and 109, respectively. Waveforms 313 and 315 illustrate the voltage at nodes 219 and 229, respectively. When the input signal 301 is low, voltage at node 219 (waveform 313) is approximately 0.4 volts and voltage at gate of transistor 107 (waveform 309) is approximately zero and therefore, transistor 107 is on. At the same time, voltage at node 229 (waveform 315) is approximately 0.6 volts and voltage at gate of transistor 109 (waveform 311) is approximately 0.6 volts and therefore, transistor 109 is off. This example illustrates that the voltage at gate of transistor 109 is boosted from VDDL=0.4 volts to approximately 0.6 volts that helps to turn off transistor 109 more completely.

When the input signal 301 transitions from low to high at about 3 ns (in this example VDDL=0.4 volts), voltage at node 219 (waveform 313) transitions from approximately 0.4 volts to approximately 0.6 volts. As discussed above, this transition can be delayed because of, for example, two inverters 115 and 211. Around the same time, voltage at gate of transistor 107 (waveform 309) transitions from approximately zero volts to approximately 0.6 volts (boosted from VDDL=0.4 volts), which helps to turn off transistor 107 more completely. Similarly, during this transition, voltage at node 229 (waveform 315) transitions from approximately 0.6 volts to approximately 0.4 volts. As discussed above, this transition can be delayed because of, for example, inverters 115, 211, and 221. Around the same time, voltage at gate of transistor 109 (waveform 311) transitions from approximately 0.6 volts to approximately 0 volts which turns on transistor 109. During this transition, the output signal 303 transitions (with some delay due to, for example, the inverters) from approximately 0 volts to approximately VDDH=0.8 volts.

When the input signal 301 transitions from high to low at about 4 ns, voltage at node 219 (waveform 313) transitions from approximately 0.6 volts to approximately 0.4 volts. As discussed above, this transition can be delayed because of, for example, two inverters 115 and 211. Around the same time, the voltage at gate of transistor 107 (waveform 309) transitions from approximately 0.6 volts to approximately 0 volts, which turns on transistor 107. Similarly, during this transition, voltage at node 229 (waveform 315) transitions from approximately 0.4 volts to approximately 0.6 volts. As discussed above, this transition can be delayed because of, for example, inverters 115, 211, and 221. Around the same time, voltage at gate of transistor 109 (waveform 311) transitions from approximately 0 volts to approximately 0.6 volts (boosted from VDDL=0.4 volts), which helps to turn off transistor 109 more completely. During this transition, the output signal 303 transitions (with some delay due to, for example, the inverters) from approximately VDDH=0.8 volts to approximately 0 volts.

According to one example, capacitive elements 215 and 225 are implemented using transistors that are connected as capacitors. However, the embodiments of this disclosure are not limited to these examples and capacitive elements 215 and 225 can be any other types of capacitors available in a process technology, for example, but not limited to, metal insulator metal (MIM) capacitor, metal oxide metal (MOM) capacitor, etc. Additionally or alternatively, capacitors 215 and 225 can be created using parasitic metal wiring capacitance, where certain types of metal can be routed in certain patterns to create a parasitic capacitor from the metal wiring.

According to one example, VDDL is as low as around 300 millivolts (my) and VDDH is around 1 volts. However, it is noted that VDDL and VDDH can include other values. In the level shifter designs of another approach, a difference of 400 my or larger between VDDH and VDDL can result in the problems of not being able to switch the output between logic 0 to 1 with this level shifter circuit of another approach with those level shifter's operation.

According to one embodiment, boosting circuits 203 and 205 can be shared between two or more core level shifter circuits 201. In other words, when a plurality of core level shifter circuits that convert a plurality of input signals to a plurality of output signals, the plurality of level shifter circuits can share the boosting circuits 203 and 205 (or capacitors 215 and 225.) In this example, boosting circuits 203 and 205 can boost the respective core level shifter circuit's internal voltage (e.g., voltages to gates of transistors 107 and 109 of FIGS. 1, 2, and 4 for each of the core level shifter circuits), as discussed above, when the input signal to that respective core level shifter circuit changes.

In this example, one implementation includes an event driven logic/circuit to detect the transition in each of the input signals to create a boosted voltage for the core level shifter circuit associated with the input signal that had the transition. For example, an OR circuit is used to combine all the input signals (to all respective core level shifter circuits). Another example includes using an edge detector to detect the transitions in the input signals. Additionally or alternatively, a clock is input to the boosting circuits 203 and 205 so that a boosting signal is created at each cycle and the boosted voltage is input to the appropriate core level shifter circuit that needs boosting at that time cycle.

Figure 4:
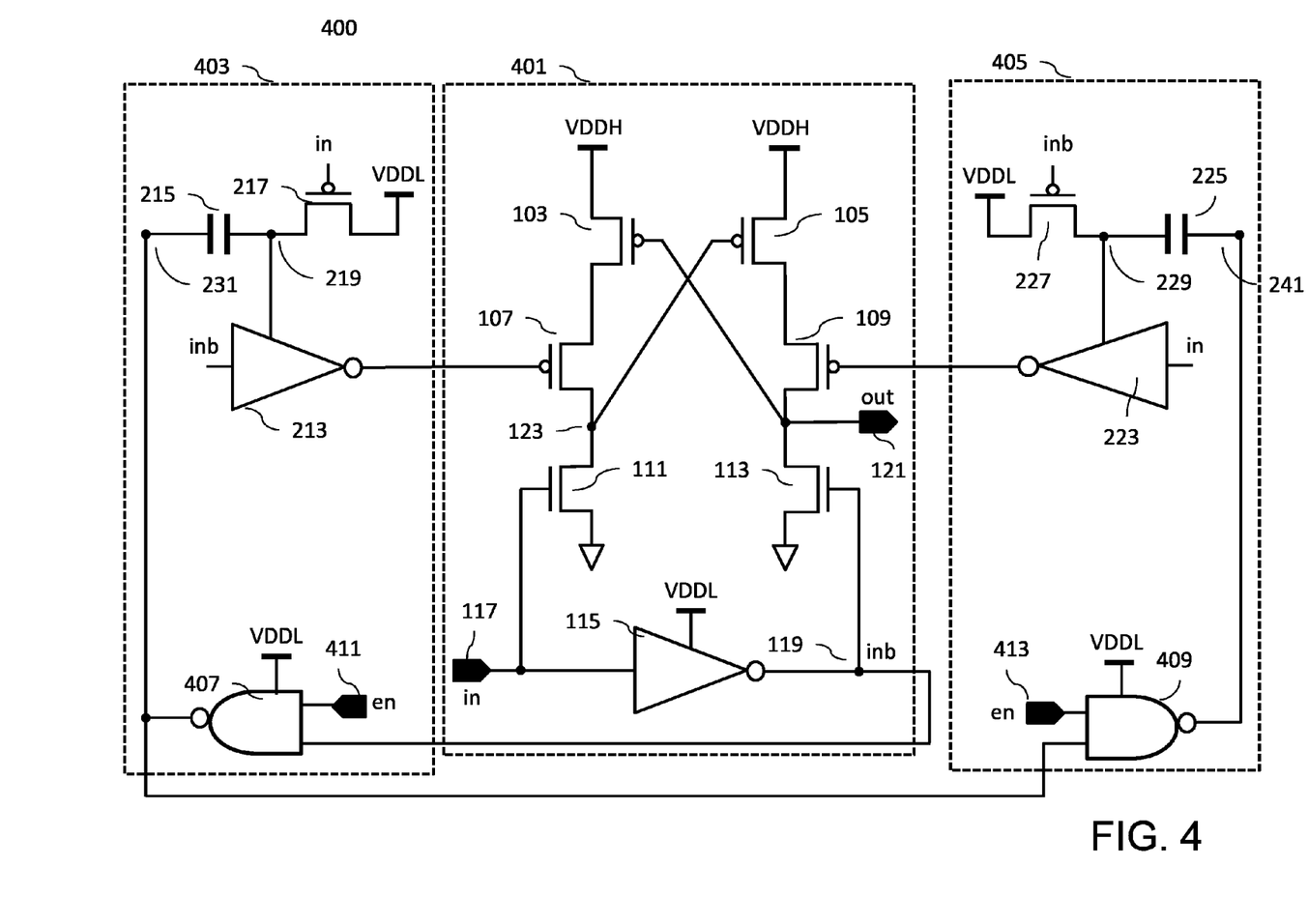
FIG. 4 illustrates a level shifter circuit with boosting circuit(s), in accordance with some embodiments.

FIG. 4 illustrates another level shifter circuit with boosting circuit(s), in accordance with some embodiments. Level shifter circuit 400 includes a core level shifter circuit 401 and one or more boosting circuits (e.g., charge pump circuits) 403 and 405. In one embodiment, core level shifter circuit 401 of FIG. 4 is similar to core level shifter circuit 101 of FIG. 1 and/or core level shifter circuit 201 of FIG. 2. However, other examples of core level shifter circuits can also be used. In one example, boosting circuits 403 and 405 of FIG. 4 are exemplary embodiments of boosting circuits 125 and 127 of FIG. 1. However, other examples of boosting circuits can also be used.

According to this example, inverters 211 and 221 of FIG. 2 are replaced with negative AND (NAND) circuits/gates 407 and 409, and enable input terminals 411 and 413 are introduced. In this example, the boosting circuits 403 and 405 will operate when the enable signal is high, but will not operate when the enable signal is low. Therefore, if the difference between VDDL and VDDH is low enough that core level shifter circuit 401 can operate without boosting (for example, but not limited to, lower than 400 mv), the enable signal to ports/input terminals 411 and 413 are low (e.g., 0) so that boosting circuits 403 and 405 will not operate in order to save power. If the difference between VDDL and VDDH is high (for example, but not limited to, higher than 400 mv), the enable signal to ports/input terminals 411 and 413 can be high (e.g., 1) so that core level shifter circuit 401 can use the boosting voltage from boosting circuits 403 and 405, which will operate in a similar way to boosting circuits 203 and 205. However, the embodiments of this disclosure are not limited to these examples and other boosting circuits are within the scope of this disclosure.

According to one example, a user can set the enable signal based on the difference VDDL and VDDH. Additionally or alternatively, level shifter circuit 400 can include and/or be connected to a logic (e.g. a controller) that can receive VDDL and VDDH (and/or values of these voltages), can determine a difference between VDDL and VDDH, and can compare the difference with a threshold to generate the enable signal. This enable signal can be a domain level, chip level, and/or partition level signal that can be share across all level shifter circuits.

Embodiment of this disclosure provided level shifter circuits that use a boosting circuit. The boosting circuit is configured to improve the operation of the level shifter circuit when the high voltages of voltage domains across the level shifter circuit are widely separated.

According to one embodiment of the disclosure, a circuit apparatus includes a core level shifter circuit that is configured to change a first voltage of an input signal to a second voltage of an output signal. The circuit apparatus further includes a first boosting circuit coupled to the core level shifter circuit, where the first boosting circuit is configured to generate a first transient voltage to the core level shifter when the input signal transitions from a low value to a high value. The circuit apparatus further includes a second boosting circuit coupled to the core level shifter circuit, where the second boosting circuit is configured to generate a second transient voltage to the core level shifter when the input signal transitions from a high value to a low value.

According to another embodiment of the disclosure, a circuit apparatus includes a core level shifter circuit that is configured to change a first voltage of an input signal to a second voltage of an output signal. The circuit apparatus also includes a first boosting circuit. The first boosting circuit includes a first capacitive element, a first terminal of the first capacitive element is coupled to the core level shifter, a second terminal of the first capacitive element is connected to a first P-type field effect transistor (PFET). A gate of the first PFET is coupled to the input signal and the first PFET is also coupled to a first power supply. The first boosting circuit further includes a first inverter, an input terminal of the first inverter is coupled to an inverted input signal and an output terminal of the first inverter is coupled to the core level shifter circuit, the first inverter is coupled to second terminal of the first capacitive element. The circuit apparatus also includes a second boosting circuit. The second boosting circuit includes a second capacitive element, a first terminal of the second capacitive element is coupled to the core level shifter circuit, a second terminal of the second capacitive element is connected to a second P-type field effect transistor (PFET). A gate of the second PFET is coupled to the inverted input signal and the second PFET is also coupled to the first power supply. The second boosting circuit further includes a second inverter, an input terminal of the second inverter is coupled to the input signal and an output terminal of the second inverter is coupled to the core level shifter circuit, the second inverter is coupled to second terminal of the second capacitive element.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit apparatus, comprising:
a core level shifter circuit configured to change a first voltage of an input signal to a second voltage of an output signal;
a first boosting circuit coupled to the core level shifter circuit and configured to generate a first transient voltage applied to the core level shifter circuit when the input signal transitions from a low value to a high value, wherein the first boosting circuit comprises:
a first inverting element, an input terminal of the first inverting element coupled to an inverted version of the input signal and an output terminal of the first inverting element coupled to the core level shifter circuit, the first inverting element having a voltage supply provided by a first terminal of a first capacitive element; and
a second boosting circuit coupled to the core level shifter circuit and configured to generate a second transient voltage applied to the core level shifter circuit when the input signal transitions from the high value to the low value.

2. The circuit apparatus of claim 1, wherein the first boosting circuit is configured to charge the first capacitive element when the input signal is at the low value.

3. The circuit apparatus of claim 2, wherein the first capacitive element is configured to release its charge to generate the first transient voltage when the input signal transitions from the low value to the high value.

4. The circuit apparatus of claim 1, wherein the first transient voltage is larger than the first voltage of the input signal but less than twice the first voltage of the input signal.

5. The circuit apparatus of claim 1, wherein the second boosting circuit is configured to charge a second capacitive element when the input signal is at the high value.

6. The circuit apparatus of claim 5, wherein the second capacitive element is configured to release its charge to generate the second transient voltage when the input signal transitions from the high value to the low value.

7. The circuit apparatus of claim 1, wherein the second transient voltage is larger than the first voltage of the input signal but less than twice the first voltage of the input signal.

8. The circuit apparatus of claim 1, wherein the first boosting circuit further comprises:
a second inverting element, an input terminal of the second inverting element coupled to the core level shifter circuit and an output terminal of the second inverting element connected to a second terminal of the first capacitive element; and
a first P-type field effect transistor (PFET) having a drain connected to the first terminal of the first capacitive element, a gate coupled to the input signal, and a source coupled to a first power supply.

9. The circuit apparatus of claim 8, wherein the second boosting circuit comprises:
a third inverting element, an input terminal of the third inverting element coupled to the core level shifter circuit and an output terminal of the third inverting element connected to a first terminal of a second capacitive element; and
a second PFET having a drain connected to a second terminal of the second capacitive element, a gate coupled to the inverted version of the input signal, and a source coupled to the first power supply.

10. The circuit apparatus of claim 9, wherein the second boosting circuit further comprises:
a fourth inverting element, an input terminal of the fourth inverting element coupled to the input signal and an output terminal of the fourth inverting element coupled to the core level shifter circuit, the fourth inverting element having a voltage supply provided by the second terminal of the second capacitive element.

11. The circuit apparatus of claim 1, wherein the first boosting circuit further comprises:
a first negative AND (NAND) circuit, a first input terminal of the first NAND circuit coupled to the core level shifter circuit, a second input terminal of the first NAND circuit configured to receive an enable signal, and an output terminal of the first NAND circuit connected to a second terminal of the first capacitive element; and
a first P-type field effect transistor (PFET) having a drain connected to the first terminal of the first capacitive element, a gate coupled to the input signal, and a source coupled to a first power supply.

12. The circuit apparatus of claim 11, wherein the second boosting circuit comprises:
a second NAND circuit, a first input terminal of the second NAND circuit coupled to the core level shifter circuit, a second input terminal of the NAND circuit configured to receive the enable signal, and an output terminal of the second NAND circuit connected to a first terminal of a second capacitive element;
a second PFET having a drain connected to a second terminal of the second capacitive element, a gate coupled to the inverted version of the input signal, and a source coupled to the first power supply; and
a second inverting element, an input terminal of the second inverting element coupled to the input signal and an output terminal of the second inverting element coupled to the core level shifter circuit, the second inverting element having a voltage supply provided by the second terminal of the second capacitive element.

13. A circuit apparatus, comprising:
a core level shifter circuit configured to change a first voltage of an input signal to a second voltage of an output signal;
a first boosting circuit comprising:
a first P-type field effect transistor (PFET) having a drain coupled to a first terminal of a first capacitive element, a gate coupled to the input signal, and a source coupled to a first power supply; and
a first inverting element, an input terminal of the first inverting element coupled to an inverted version of the input signal and an output terminal of the first inverting element coupled to the core level shifter circuit, the first inverting element having a voltage supply provided by the first terminal of the first capacitive element; and
a second boosting circuit comprising:
a second PFET having a drain coupled to a first terminal of a second capacitive element, a gate coupled to the inverted version of the input signal, and a source coupled to the first power supply; and
a second inverting element, an input terminal of the second inverting element coupled to the input signal and an output terminal of the second inverting element coupled to the core level shifter circuit, the second inverting element having a voltage supply provided by the first terminal of the second capacitive element.

14. The circuit apparatus of claim 13, wherein the first boosting circuit further comprises:
   a third inverting element, an input terminal of the third inverting element coupled to the core level shifter circuit and an output terminal of the third inverting element coupled to a second terminal of the first capacitive element.

15. The circuit apparatus of claim 13, wherein the second boosting circuit further comprises:
   a fourth inverting element, an input terminal of the fourth inverting element coupled to the core level shifter circuit and an output terminal of the fourth inverting element coupled to a second terminal of the second capacitive element.

16. The circuit apparatus of claim 13, wherein the first boosting circuit further comprises:
   a first negative AND (NAND) circuit, a first input terminal of the first NAND circuit coupled to the core level shifter circuit, a second input terminal of the first NAND circuit configured to receive an enable signal, and an output terminal of the first NAND circuit coupled to a second terminal of the first capacitive element.

17. The circuit apparatus of claim 16, wherein the second boosting circuit comprises:
   a second NAND circuit, a first input terminal of the second NAND circuit coupled to the core level shifter circuit, a second input terminal of the second NAND circuit configured to receive the enable signal, and an output terminal of the second NAND circuit coupled to a second terminal of the second capacitive element.

18. The circuit apparatus of claim 13, wherein the first boosting circuit is configured to charge the first capacitive element when the input signal is at a low value.

19. The circuit apparatus of claim 13, wherein the second boosting circuit is configured to charge the second capacitive element when the input signal is at a high value.

20. A circuit apparatus, comprising:
   a core level shifter circuit configured to change a first voltage of an input signal to a second voltage of an output signal;
   a first boosting circuit coupled to the core level shifter circuit and configured to generate a first transient voltage applied to the core level shifter circuit when the input signal transitions from a low value to a high value, wherein the first boosting circuit comprises:
      a first inverting element, an input terminal of the first inverting element coupled to the core level shifter circuit and an output terminal of the first inverting element is connected to a first terminal of a first capacitive element; and
      a first P-type field effect transistor (PFET) having a drain connected to a second terminal of the first capacitive element, a gate coupled to the input signal, and a source coupled to a first power supply; and
   a second boosting circuit coupled to the core level shifter circuit and configured to generate a second transient voltage applied to the core level shifter circuit when the input signal transitions from the high value to the low value.

* * * * *